(12) United States Patent
Koo

(10) Patent No.: US 7,507,644 B2
(45) Date of Patent: Mar. 24, 2009

(54) METHOD OF FORMING DIELECTRIC LAYER OF FLASH MEMORY DEVICE

(75) Inventor: Jae Hyoung Koo, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 61 days.

(21) Appl. No.: 11/489,230

(22) Filed: Jul. 19, 2006

(65) Prior Publication Data

US 2007/0134874 A1    Jun. 14, 2007

(30) Foreign Application Priority Data

Dec. 12, 2005   (KR) ..................... 10-2005-0121665

(51) Int. Cl.
    *H01L 21/20* (2006.01)
(52) U.S. Cl. .............. 438/485; 438/240; 438/261; 438/287; 438/591; 438/763; 438/775; 438/778; 438/785
(58) Field of Classification Search .......... 438/240, 438/261, 287, 485, 591, 763, 775, 778, 785
    See application file for complete search history.

(56) References Cited

U.S. PATENT DOCUMENTS

| 6,187,633 | B1 * | 2/2001 | Dong et al. ............. 438/261 |
| 6,849,897 | B2 * | 2/2005 | Dong et al. ............. 257/316 |
| 6,967,135 | B1 * | 11/2005 | Lee ........................ 438/239 |
| 7,122,415 | B2 * | 10/2006 | Jang et al. ............... 438/201 |
| 7,148,109 | B2 * | 12/2006 | Joo ........................ 438/261 |
| 2002/0153579 | A1 * | 10/2002 | Yamamoto ............... 257/412 |
| 2003/0030099 | A1 * | 2/2003 | Hsieh et al. ............. 257/315 |
| 2003/0143319 | A1 * | 7/2003 | Park et al. ............... 427/64 |
| 2004/0005748 | A1 * | 1/2004 | Hyun et al. ............. 438/197 |
| 2006/0009043 | A1 * | 1/2006 | Cho et al. ............... 438/763 |

FOREIGN PATENT DOCUMENTS

| JP | 2002-314072 | 10/2002 |
| KR | 10-2005-0012638 | 2/2005 |
| KR | 10-2005-0122634 | 12/2005 |

* cited by examiner

*Primary Examiner*—Andy Huynh
(74) *Attorney, Agent, or Firm*—Marshall, Gerstein & Borun LLP

(57) ABSTRACT

A method of manufacturing a flash memory device, wherein according to one embodiment, when a high dielectric material is formed by a remote plasma atomic layer deposition method, first and second dielectric layers are formed by one process at the same time using silicate as the first dielectric layer and the high dielectric layer formed on the silicate as the second dielectric layer. Accordingly, cost can be saved since the process is shortened, a film quality better than that of the existing dielectric layer structure can be obtained, and a film with improved step coverage can be formed. Furthermore, capacitance and insulating breakdown voltage can be increased by using silicate having a high dielectric constant and a high dielectric layer.

6 Claims, 2 Drawing Sheets

METHOD OF FORMING DIELECTRIC LAYER OF FLASH MEMORY DEVICE

BACKGROUND

1. Field of the Invention

The invention relates generally to a method of manufacturing semiconductor memory devices and, ore particularly, to a method of forming a dielectric layer of a flash memory device using a remote plasma atomic layer deposition method.

2. Discussion of Related Art

A flash memory device of semiconductor devices is a nonvolatile memory device in which information stored in memory cells can be maintained although power is not supplied and high-speed electrical erase is possible with it being mounted in a circuit board. Much research has been done into the flash memory device due to its structure advantageous for high-integration.

A cell gate of the flash memory device has a lamination structure of a tunnel oxide film, a floating gate, a dielectric layer, and a control gate. The dielectric layer has a lamination structure of a lower oxide film, a nitride film, and an upper oxide film, and has a great effect on the program, erase, and read of the cell.

In the related art dielectric layer, the lower oxide film and the upper oxide film are formed using dichlorosilane (SiH2Cl2) (DCS) or monosilane (SiH4) (MS)—based chemical vapor deposition (CVD). The oxide film formed by such chemical vapor reaction is problematic in that it has a film quality lower than that of an oxide film formed by typical and wet oxidization and has a low step coverage of 85% or less.

Furthermore, as semiconductor devices have become more highly integrated, a thickness of the lower oxide film, the nitride film, and the upper oxide film (i.e., the general structure of the dielectric layer) is reduced. Accordingly, a problem arises because the leakage current and/or the reliability characteristic are degraded.

As a solution for solving these problems, research has been done into metal oxide having a dielectric constant higher than that of the oxide film or the nitride film as substitution materials of the next-generation devices. In other words, if the dielectric constant is high, the physical thickness required to produce the same capacitance can be increased. Accordingly, in the effective oxide thickness (EOT), the leakage current characteristic and the charge retention characteristic can be improved compared with the oxide film.

A method of depositing the high-k material may include a physical deposition method (PVD), CVD, and so on. In the case where a floating gate is formed of an amorphous silicon film when a high dielectric material is deposited by the related art PVD or CVD, a thick silicate film is formed during annealing after a thin silicate interface is formed between the high dielectric material and the amorphous silicon film. However, there are problems in that the silicate film formed as described above is not uniform and has a low film quality since a thickness cannot be controlled.

SUMMARY OF THE INVENTION

In one embodiment, the invention provides a method of forming a dielectric layer of a flash memory device, in which a silicate film having a thickness that can be controlled uniformly while using a high dielectric material can be formed, thereby improving characteristics of the device.

In another embodiment, the invention provides a method of forming a dielectric layer of a flash memory device, in which two dielectric layers are formed by one process, thereby simplifying the process.

Accordingly, one aspect of the invention provides a method of forming a dielectric layer of a flash memory device, including the steps of forming a tunnel oxide film and a polysilicon layer on a semiconductor substrate and then depositing a high dielectric material by a remote plasma atomic layer deposition method, thereby forming a first dielectric layer; depositing the high dielectric material on the first dielectric layer by a plasma atomic layer deposition method, thereby forming a second dielectric layer; and forming a third dielectric layer on the second dielectric layer.

The remote plasma atomic layer deposition method and the plasma atomic layer deposition method may thereby employ a metal organic material or a halide as a source gas.

The remote plasma atomic layer deposition method and the plasma atomic layer deposition method may preferably employ any one of $O_2$, $N_2O$, NO, Ar, $N_2$, $H_2$, and mixtures thereof as a reaction gas.

The remote plasma atomic layer deposition method and the plasma atomic layer deposition method may preferably employ materials, such as $Al_2O_3$, $HfO_2$, $ZrO_2$, SiON, $La_2O_3$, $Y_2O_3$, $TiO_2$, $CeO_2$, $N_2O_3$, $Ta_2O_5$, $BaTiO_3$, $SrTiO_3$, BST, and PZT, and mixture oxide, such as $Hf_xAl_yO_z$, $Zr_xAl_yO_z$, $HfSiO_4$, and $ZrSiO_4$, as a hi raw material.

The method may further include the step of nitrifying a top surface of the second dielectric layer preferably using one of $N_2O$ plasma, NO plasma, and $N_2$ plasma.

The third dielectric layer may preferably be formed using a high dielectric material by a remote plasma atomic layer deposition method, or using $SiO_2$ by the related art PVD or CVD.

According to another aspect, the invention provides a method of forming a dielectric layer of a flash memory device, including the steps of forming a tunnel oxide film and a polysilicon layer on a semiconductor substrate and then depositing a high dielectric material by a direct plasma atomic layer deposition method, thereby forming a first dielectric layer; depositing the high dielectric material on the first dielectric layer by a direct plasma atomic layer deposition method, thereby forming a second dielectric layer; and forming a third dielectric layer on the second dielectric layer by a direct plasma atomic layer deposition method, PVD or CVD.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The invention will be described in detail in connection with certain exemplary embodiments with reference to the accompanying drawings.

Figure 1:
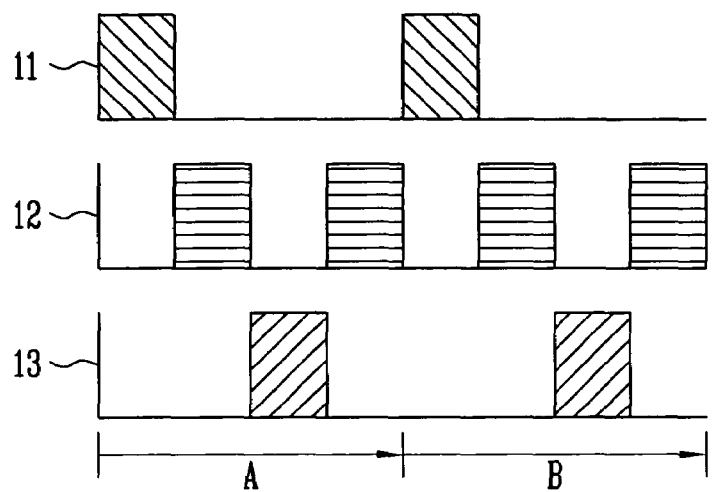
FIG. 1 is a view illustrating an atomic layer deposition method.

FIG. 1 is a view illustrating an atomic layer deposition method to which the invention is applied.

Referring to FIG. 1, the plasma atomic layer deposition method is a method of depositing a film through adsorption and desorption reactions by repeating (B) a cycle (A) in which a metal organic material and halide are injected as a source gas 11, a purge process 12 is performed, $O_2$, $N_2O$, NO, Ar, $N_2$, $H_2$, and so on are injected as a reaction gas 13 when plasma is generated, and the purge process 12 is then performed again.

By applying such plasma to the atomic layer deposition method, a thin film having reduced impurity levels and a high density can be obtained. This can be accomplished through the collision phenomenon of ion generated by plasma and the atomic layer deposition method employing a reactive radical. Furthermore, the thin film formed by plasma has good physical and electrical characteristic.

In addition, since impurities, such as carbon and oxygen, are reduced, the thin film can be deposited at low temperature since activation energy is lowered. Accordingly, the productivity and heat efficiency can be enhanced with a high deposition speed. Furthermore, high reactive radicals can be produced employing stabilized gases, such as oxygen, hydrogen, nitrogen, $N_2O$, and NO, as plasma. Therefore, a precursor and a reaction gas can be freely selected.

Meanwhile, if input power of plasma (i.e., a process parameter) is increased, the density between electrons and radicals is increased to accelerate the deposition speed. If the pressure is lowered, an efficiency in which the diffusion speed of radical and electron energy are transferred during activation is increased. The productivity and the thin film characteristics can be maximized by optimizing the plasma condition as described above. However, there are disadvantages in that the etch phenomenon is generated due to ion collision, and the film quality becomes irregular due to the physical reaction of the plasma.

Accordingly, in order to minimize these disadvantages, the invention employs the remote plasma atomic layer deposition method in which the influence incurred by ion collision can be reduced and only the reactive radical can be introduced.

In the remote plasma atomic layer deposition method in accordance with the invention, silicate is first formed and the high dielectric thin film is then formed, unlike the related art PVD or CVD method in which after the high dielectric material is formed, silicate is formed during annealing. Accordingly, first and second dielectric layers can be formed by one process in such a manner that silicate is used as the first dielectric layer and the high dielectric material is used as the second dielectric layer.

By using the high dielectric material, the leakage current characteristic and the charge retention characteristic can be improved in comparison with $SiO_2$ in the same EOT. Furthermore, since deposition can be performed at a temperature of 400° C. or less, the degradation of the reliability of the tunnel oxide film, which is incurred by thermal defects, can be prevented.

A method based on the principle according to an embodiment of the invention will be described below with reference to FIG. 2.

FIGS. 2A to 2D are cross-sectional views illustrating a gate formation method of a flash memory according to an embodiment of the invention.

Figure 2A:
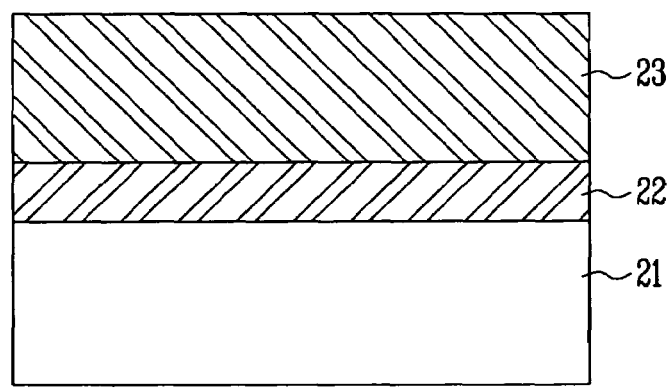
FIGS. 2A to 2D are cross-sectional views illustrating a gate formation method of a flash memory according to an embodiment of the invention.

Referring to FIG. 2A, a tunnel oxide film 22 is formed on a semiconductor substrate 21. A polysilicon layer 23 as a floating gate is formed on the tunnel oxide film 22.

Figure 2B:
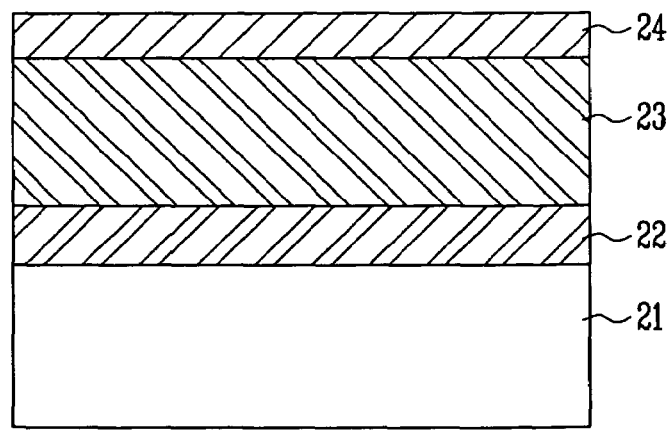

FIG. 2B corresponds to the step of forming a dielectric layer using the remote plasma atomic layer deposition method. In this step, a first dielectric layer 24 is formed of silicate by generating remote plasma, which has a small effect on ion with a remote device being mounted outside a chamber. In more detail, a high dielectric material is injected preferably at a deposition temperature of 300° C. to 400° C., thereby forming silicate at the initial cycle. A thickness of the silicate is controlled depending on a cycle number, plasma power, the type of a gas, and/or the flow rate.

Figure 2C:
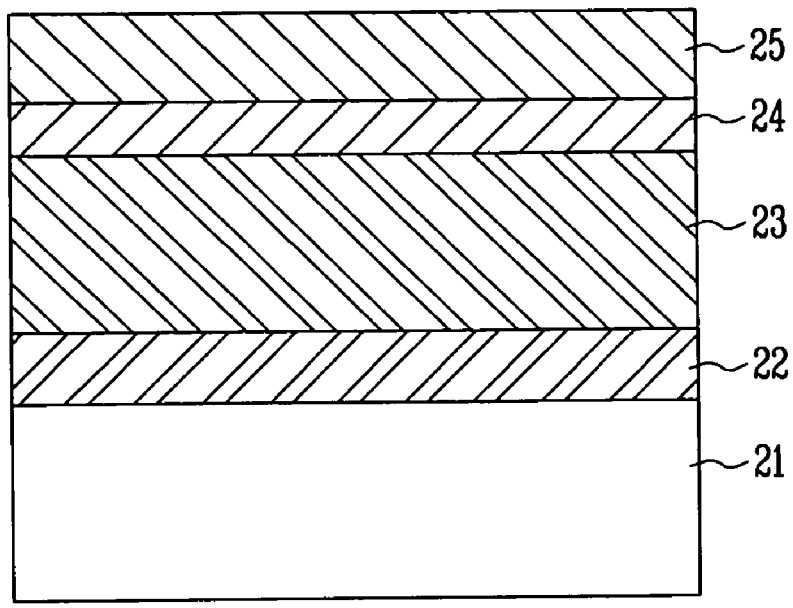

Referring to FIG. 2C, a high dielectric layer as a second dielectric layer 25 is formed on the first dielectric layer 24 (i.e., silicate). In more detail, the high dielectric layer (i.e., the second dielectric layer 25) is preferably formed by using a metal organic material or a halide as a plasma source gas and using $O_2$, $N_2O$, NO, $H_2O$, $O_3$, or the like as a reaction gas when plasma occurs in the same chamber by the plasma atomic layer deposition method.

The term "high dielectric raw material" refers to a dielectric material having a dielectric constant higher than that of $SiO_2$ (i.e., 3.9). The high dielectric raw material may include materials, such as $Al_2O_3$, $HfO_2$, $ZrO_2$, $SiON$, $La_2O_3$, $Y_2O_3$, $TiO_2$, $CeO_2$, $N_2O_3$, $Ta_2O_5$, $BaTiO_3$, $SrTiO_3$, BST, and PZT, and mixed oxides, such as $Hf_xAl_yO_z$, $Zr_xAl_yO_z$, $HfSiO_4$, and $ZrSiO_4$, for example, where x+y+z=1.

In the case of atomic layer deposition, the HfAlO mixture oxide may preferably be deposited by injecting the Hf source, the oxygen reaction gas, the Al source, and the oxygen reaction gas, in sequence (for reference, purge processes are interposed between the source gas pulses and the reaction gas pulses). Using this procedure, when the Hf source, the oxygen reaction gas, the Al source, and the oxygen reaction gas are injected in sequence, Hf and Al are preferably mixed in the ratio of 1:1. However, in a different cycle, when the Hf source, the oxygen reaction gas, the Hf source, the oxygen reaction gas, the Al source, and the oxygen reaction gas are injected in sequence, Hf and Al are mixed in the ratio of 2:1.

Further, in yet another cycle, when the Hf source, the oxygen reaction gas, the Al source, the oxygen reaction gas, the Al source, and the oxygen reaction gas are injected in sequence, Hf and Al are mixed in the ratio of 1:2. Thus, the composition is changed according to how many times the Hf source and the Al source are pulsed.

Furthermore, a top surface of the formed second dielectric layer may preferably be nitrified by a $N_2O$, NO, $N_2$ plasma method.

Figure 2D:
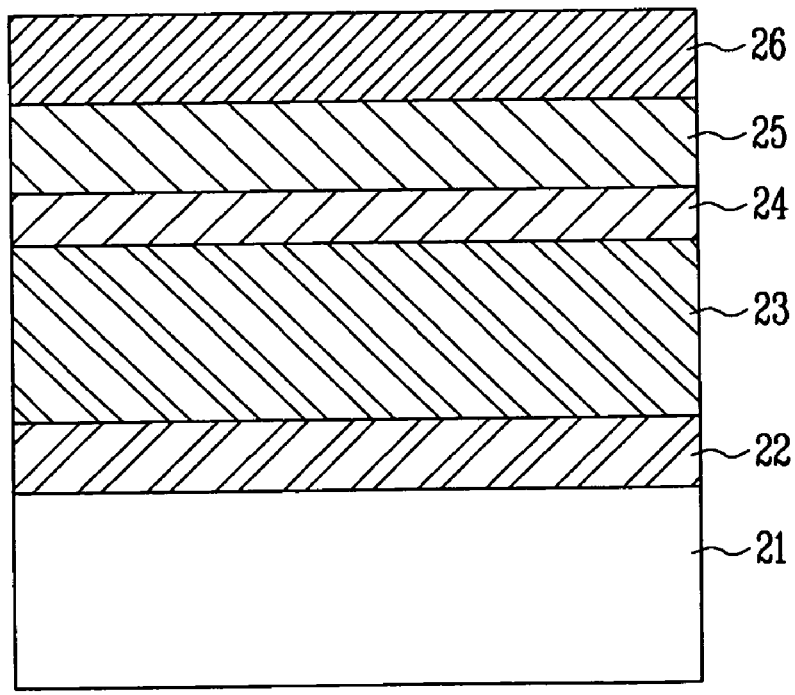

Referring to FIG. 2D, a third dielectric layer 26 is formed using a high dielectric material by the remote plasma atomic layer deposition method, or using $SiO_2$ by the related art PVD or CVD. Accordingly, the structure of the first dielectric layer 24, the second dielectric layer 25, and the third dielectric layer 26 is completed.

Alternatively, the following method may be used other than the remote plasma atomic layer deposition method. A tunnel oxide film and a polysilicon layer may be formed at predetermined regions on a semiconductor substrate. A high dielectric material may be deposited by a direct plasma atomic layer deposition method, thus forming a first dielectric layer. A high dielectric material may be deposited on the first dielectric layer by the direct plasma atomic layer deposition method, thus forming a second dielectric layer. A third dielectric layer may be formed by the direct plasma atomic layer deposition method, PVD, or CVD.

As described above, according to the invention, when the high dielectric material is formed by the remote plasma atomic layer deposition method, first and second dielectric layers are formed by one process at the same time by using silicate as the first dielectric layer and the high dielectric layer formed on the silicate as the second dielectric layer. Accordingly, the invention is advantageous in that cost can be saved since the process is shortened, a film quality better than that of the existing dielectric layer structure can be obtained, and a film with improved step coverage can be formed.

Furthermore, capacitance and insulating breakdown voltage can be increased by using silicate having a high dielectric constant and a high dielectric layer.

In addition, since plasma is employed, a more dense thin film can be formed. By using a high dielectric material, the leakage current and the capacitance characteristic can be improved in the same EOT compared with $SiO_2$. In addition, since deposition is preferably performed at a temperature of 400° C. or less, the reliability of a tunnel oxide film can be prevented from being lowered due to thermal damage.

While the invention has been described in connection with practical exemplary embodiments, the invention is not limited to the disclosed embodiments but, to the contrary, is intended to cover various modifications and equivalent arrangements included within the spirit and scope of the appended claims.

What is claimed is:

1. A method of forming a dielectric layer of a flash memory device, the method comprising:
    forming a tunnel oxide film and a polysilicon layer on a semiconductor substrate;
    forming a first dielectric layer using a high dielectric material selected from the group consisting of $Al_2O_3$, $HfO_2$, $ZrO_2$, SiON, $La_2O_3$, $Y_2O_3$, $TiO_2$, $CeO_2$, $N_2O_3$, $Ta_2O_5$, $BaTiO_3$, $SrTiO_3$, BST, PZT, and mixed oxides on the polysilicon layer by a remote plasma atomic layer deposition method;
    forming a second dielectric layer using a high dielectric material selected from the group consisting of $Al_2O_3$, $HfO_2$, $ZrO_2$, SiON, $La_2O_3$, $Y_2O_3$, $TiO_2$, $CeO_2$, $N_2O_3$, $Ta_2O_5$, $BaTiO_3$, $SrTiO_3$, BST, PZT, and mixed oxides on the first dielectric layer by a plasma atomic layer deposition method;
    nitrifying a top surface of the second dielectric layer; and
    forming a third dielectric layer on the nitrified top surface of the second dielectric layer.

2. The method of claim 1, wherein the remote plasma atomic layer deposition method and the plasma atomic layer deposition method employ a metal organic material or a halide as a source gas.

3. The method of claim 1, wherein the remote plasma atomic layer deposition method and the plasma atomic layer deposition method employ a reaction gas selected from the group consisting of $O_2$, $N_2O$, NO, Ar, $N_2$, $H_2$, and mixtures thereof.

4. The method of claim 1, wherein the mixed oxides are selected from the group consisting of $Hf_xAl_yO_z$, $Zr_xAl_yO_z$, $HfSiO_4$, and $ZrSiO_4$, where $x+y+z=1$.

5. The method of claim 1, further comprising nitrifying the top surface of the second dielectric layer using one of $N_2O$ plasma, NO plasma, and $N_2$ plasma.

6. The method of claim 1, comprising forming the third dielectric layer using a high dielectric material by the remote plasma atomic layer deposition method, or using $SiO_2$ by a physical vapor deposition method or a chemical vapor deposition method.

* * * * *